(12) United States Patent
Romanov et al.

(10) Patent No.: US 10,447,167 B1
(45) Date of Patent: Oct. 15, 2019

(54) METHOD OF DC VOLTAGE—PULSE VOLTAGE CONVERSION

(71) Applicant: Closed-up Joint-Stock Company DRIVE, Novosibirsk (RU)

(72) Inventors: Yuriy I. Romanov, Novosibirsk (RU); Stanislav V. Maletskiy, Novosibirsk (RU)

(73) Assignee: Drive CJSC, Novosibirsk (RU)

( * ) Notice: Subject to any disclaimer, the term of this patent is extended or adjusted under 35 U.S.C. 154(b) by 0 days.

(21) Appl. No.: 16/073,338

(22) PCT Filed: Jan. 10, 2017

(86) PCT No.: PCT/RU2017/000005
§ 371 (c)(1),
(2) Date: Jul. 26, 2018

(87) PCT Pub. No.: WO2018/132028
PCT Pub. Date: Jul. 19, 2018

(51) Int. Cl.
*H02M 3/335* (2006.01)
*H03K 3/01* (2006.01)

(52) U.S. Cl.
CPC .......... *H02M 3/33523* (2013.01); *H03K 3/01* (2013.01)

(58) Field of Classification Search
CPC .... H02M 3/335; H02M 3/33523; H02M 1/44; H02M 1/08; H02M 7/217; H02M 7/527; H02M 7/537; H03K 3/01; H03K 3/53
See application file for complete search history.

(56) References Cited

U.S. PATENT DOCUMENTS

| | | | |
|---|---|---|---|
| 10,320,302 B2* | 6/2019 | Romanov | G05F 1/59 |
| 10,355,599 B2* | 7/2019 | Romanov | H02M 1/08 |
| 10,361,638 B2* | 7/2019 | Romanov | H02M 3/33523 |

* cited by examiner

*Primary Examiner* — Adolf D Berhane
(74) *Attorney, Agent, or Firm* — Patentagar PLLC; Alexander Rabinovich

(57) ABSTRACT

In a method of DC voltage—pulse voltage conversion, DC voltage is provided; a succession of controlling square pulses having adjustable pulse ratio is generated; an inductive load is periodically connected to outputs of a source of the DC voltage using the succession of the controlling square pulses; pulse current flowing through the inductive load is generated; a predefined value of resistance of an electronically-controlled resistor included in a circuit of the pulse current flowing through the inductive load is formed, and the pulse current is adjusted by the electronically-controlled resistor, whereby adjusting the level of pulse electromagnetic noise radiated to the environment is achieved.

1 Claim, 2 Drawing Sheets

METHOD OF DC VOLTAGE—PULSE VOLTAGE CONVERSION

CROSS-REFERENCE TO RELATED APPLICATIONS

This application is a U.S. National phase CIP application of International application PCT/RU2017/000005 filed on Jan. 19, 2017, the International application being hereby incorporated by reference in its entirety.

BACKGROUND OF THE INVENTION

1. Field of the Invention

The proposed engineering solution relates to electrical engineering and can be used in pulse power supply having reduced level of electromagnetic noise radiated to the environment, and as an additional technique among capacities for DC voltage-pulse voltage conversion.

2. Description of the Related Art

Known have been similar designs, see e.g. US 20110305048 A1 published Dec. 15, 2011, comprising the following aggregation of essential features:
providing DC voltage;
generating controlling square wave pulses with adjustable pulse ratio;
periodically connecting inductive load to outputs of a source of the DC voltage by using the succession of the controlling pulses;
generating pulse current flowing through the inductive load; and
converting DC voltage to pulse voltage.

The features which are common for the proposed solution and the above analog are:
providing DC voltage;
generating controlling square wave pulses with adjustable pulse ratio;
periodically connecting inductive load to outputs of a source of the DC voltage by using the succession of the controlling pulses;
generating pulse current flowing through the inductive load; and
converting DC voltage to pulse voltage.

Also known has been a design published as Application note FAN6300«Highly Integrated Quasi-Resonant PWM Controller» (see https://www.fairchildsemi.com/application-notes/AN/AN-6300.pdf, Rev. 1.0.2. of May 21, 2010). It was chosen as the closest analog (prototype), and it comprises the following aggregation of essential features:
providing DC voltage;
generating controlling square wave pulses with adjustable pulse ratio;
periodically connecting inductive load to outputs of a source of the DC voltage by using the succession of the controlling pulses;
generating pulse current flowing through the inductive load;
limiting pulse current flowing through the inductive load; and
converting DC voltage to pulse voltage.

The features which are common for the proposed solution and the above prototype are:
providing DC voltage;
generating controlling square wave pulses with adjustable pulse ratio;
periodically connecting inductive load to outputs of a source of the DC voltage by using the succession of the controlling pulses;
generating pulse current flowing through the inductive load;
limiting pulse current flowing through the inductive load; and
converting DC voltage to pulse voltage.

SUMMARY OF THE INVENTION

The technical result which can be achieved by neither of the above technical solutions resides in obtaining changeable output pulse voltage having lower level of electromagnetic pulse noise, thus adding to the range of capacities to perform DC-pulse voltage conversion.

The reason for failing to achieve the above goal is that no proper attention was paid to researches aimed at obtaining changeable output pulse voltage having an irreducible level of electromagnetic pulse noise radiated to the environment. Therefore, there has been a pressing need in improving known comparable technical solutions.

Taking the character and analysis of the prior art designs into account, one can conclude that the object of obtaining controllable output pulse voltage having an as low as practical level of electromagnetic pulse noise radiated to the environment is a timely one.

The above-identified technical result is accomplished in a prior art method of DC voltage to pulse voltage conversion, comprising the steps of providing DC voltage, generating controlling square wave pulses with adjustable pulse ratio, periodically connecting inductive load to outputs of a source of the DC voltage by using the succession of the controlling pulses, generating pulse current flowing through the inductive load, and limiting pulse current flowing through the inductive load, wherein the limiting of the pulse current flowing through the inductive load is performed by an electronically controlled resistor included into a circuit of the pulse current flowing through the inductive load, to thereby convert DC voltage to pulse voltage so as to make it possible to adjust the level of electromagnetic noise radiated to the environment.

Providing the process of forming a controllable value of resistance of the electronically controlled resistor allows, whereas the DC voltage applied to the inductive load is periodically on and off and a pulse current with fixed or insignificantly changing adjustable pulse ratio is formed, limiting the pulse current by the electronically controlled resistor, whereby DC voltage is converted to pulse voltage. As this takes place, and since the power of pulse electromagnetic noise radiated in the environment in the process of the DC voltage-pulse voltage conversion depends on the value of the pulse current, increasing the resistance of the electronically controlled resistor results in decreasing the pulse current flowing in the circuit feeding the inductive load. Due to that, the level of the electromagnetic noise radiated in the environment by an apparatus for DC voltage—pulse voltage conversion is decreased. Therefore, the use of the proposed technical solution improves electromagnetic compatibility of miscellaneous electronic units fed by pulse power supply and, consequently, makes environmental setting in human environment better. This is where achieving the above technical result is displayed.

Analysis performed among known prior art showed that none of them comprises either the whole aggregation of the essential features of the proposed solution or its distinguishing (characterizing) features, thus permitting the conclusion about novelty of, and inventive step in, the solution.

The technical essence of the proposed method of DC voltage—pulse voltage conversion resides in the following:
providing DC voltage;
generating a succession of controlling square pulses having adjustable pulse ratio;
periodically connecting an inductive load to outputs of a source of this DC voltage using the succession of controlling square pulses;
generating pulse current flowing through the inductive load; and
limiting the pulse current,
wherein said limiting the pulse current is performed by means of an electronically-controlled resistor included in a circuit of the pulse current flowing through the inductive load, to thereby convert the DC voltage to the pulse voltage so as to adjust the level of electromagnetic noise radiated to the environment.

BRIEF DESCRIPTION OF DRAWINGS

The above and other features and advantages of the proposed method are described in the specification below with the reference to accompanying drawings where.

DETAILED DESCRIPTION

Figure 1:
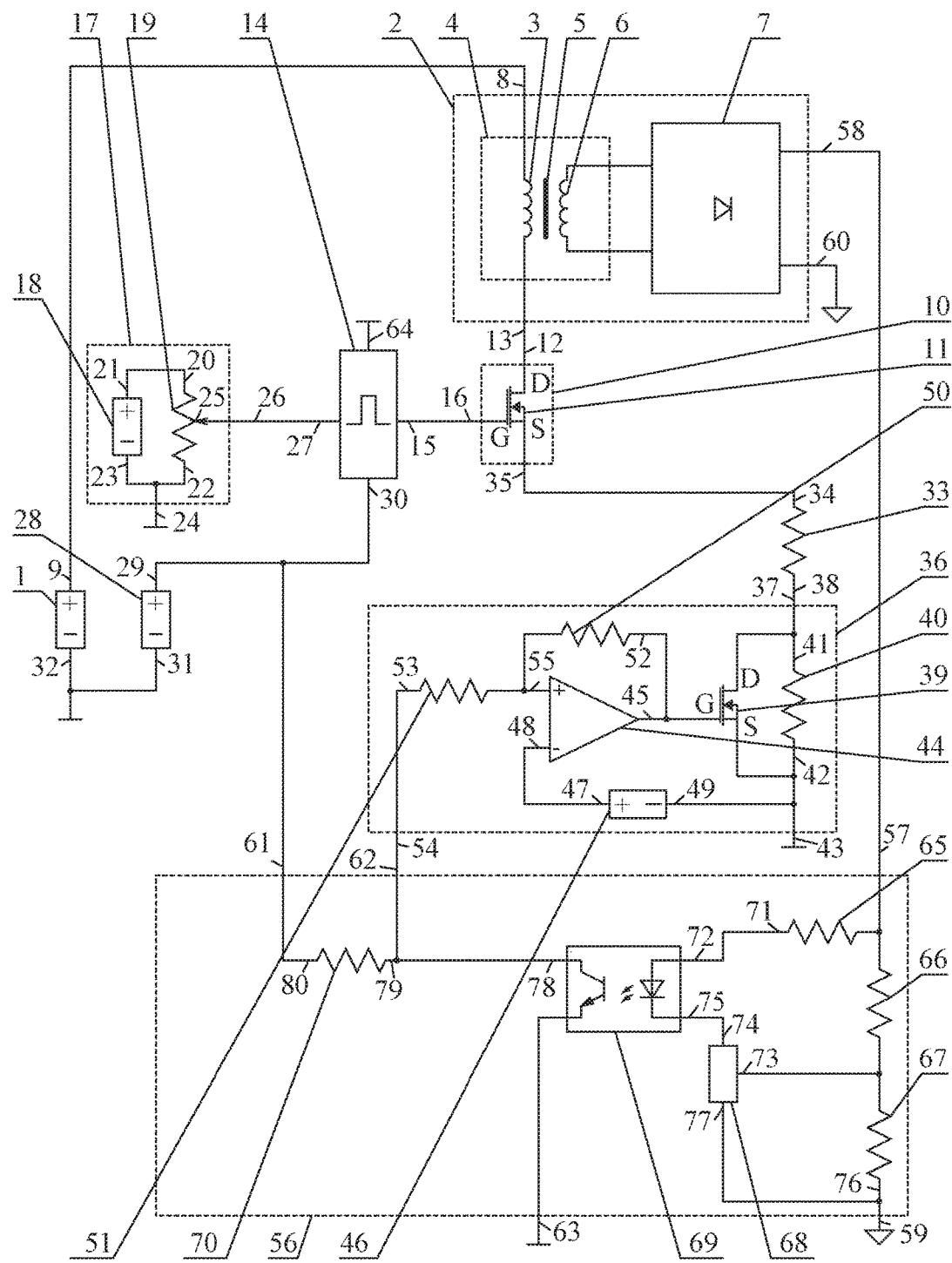
FIG. 1 is an example of a functional circuit of a DC voltage—pulse voltage converter embodying a method of the present proposal.

According to FIG. 1, the DC voltage—pulse voltage converter comprises specifically:
a high DC voltage source 1;
an inductive load 2 made as a winding on a magnetic conductor and including a primary winding 3 of a transformer 4 using a ferromagnetic core 5 and a secondary winding 6 connected to a rectifier 7 with its load (not shown), the inductive load 2 being connected via one of terminals thereof (first), 8, to a positive terminal 9 of the high DC voltage source 1;
a controllable switch 10, including, e.g., a MOS transistor 11, connected via a first (main) terminal 12 thereof (drain of the MOS transistor 11) to another (second) terminal 13 of the inductive load 2;
a controllable square wave generator 14 connected by an output 15 thereof to a control input 16 of the controllable switch 10 (gate of the MOS transistor 11 thereof);
a first control voltage driver 17 including, e.g., a DC voltage source 18 and a potentiometer 19, a first terminal 20 of the potentiometer 19 being connected to a positive terminal 21 of the DC voltage source 18, a second terminal 22 of the potentiometer 19 being connected to a negative terminal 23 of the DC voltage source 18 (which terminal 23 is a first terminal 24 of the first control voltage driver 17), a third terminal (a slider) 25 of the potentiometer 19 (which terminal 25 is a second output 26 of the first control voltage driver 17) being connected to a control input 27 of the controllable square wave generator 14;
a low DC voltage source 28, a positive terminal 29 of the source 28 being connected to a first power input 30 of the controllable square wave generator 14, a negative terminal 31 of the source 28 being connected to a negative terminal 32 of the high DC voltage source 1;
a limiting resistor 33 connected via a terminal 34 thereof to an output 35 of the controllable switch 10 (to source of the MOS transistor 11);
an electronically controlled resistor (ECR) 36 connected by a first terminal 37 thereof to another terminal 38 of the limiting resistor 33, the ECR comprising, e.g., a MOS transistor 39 (drain of the MOS transistor 39 being the first terminal 37 of the ECR 36), an additional resistor 40 (a first terminal 41 of the additional resistor 40 being connected to the drain of the MOS transistor 39, a second terminal 42 of the additional resistor 40 being connected to source of the MOS transistor 39 and to a second terminal 43 of the ECR 36), an operational amplifier (OA) 44 (an output 45 of the OA 44 being connected to gate of the MOS transistor 39), an offset voltage source (OVS) 46 (a positive terminal of the OVS 46 being connected to a non-inverting ("+") input 48 of the OA 44, a negative terminal 49 of the OVS 46 being connected to the second terminal 43 of the ECR 36), a first resistor 50, and a second resistor 51 (the first 50 and second 51 resistor being connected to each other and jointly defining transmission efficiency of the OA 44, a terminal 52 of the first resistor 50 being connected to the output 45 of the OA 44, a terminal 53 of the second resistor 51 being a control input 54 of the ECR 36, a point of connection of the first 50 and second 51 resistors being connected to an inverting ("−") input 55 of the OA 44;
a second driver 56 of control voltage (called further below a second control voltage driver 56), a first input 57 of the second control voltage driver 56 being connected to a first output 58 of the rectifier 7, a first output 59 of the second control voltage driver 56 being connected to a second output 60 of the rectifier 7, a second input 61 of the second control voltage driver 56 being connected to the positive terminal 29 of the low DC voltage source 28, a second output 62 of the second control voltage driver 56 being connected to the control input of the ECR 36, and a third output 63 of the second control voltage driver 56 being connected to the first terminal 24 of the first control voltage driver 17, to a second power input 64 of the controllable square wave generator 14, to a second terminal 43 of the ECR 36, and to the negative terminal 32 of the high voltage DC voltage source 1.

With the above in view, the second control voltage driver 56 can comprise a first current setting resistor 65, a second current setting resistor 66, a third current setting resistor 67, a voltage-stabilized current regulator 68, a optocoupler 69, and a resistor 70, the first current setting resistor 65 being connected to the second current setting resistor 66, the second current setting resistor 66 being connected to the third current setting resistor 67, a first terminal of the first current setting resistor 65 being connected to a first input 72 of the optocoupler 69, a point of connection of the first current setting resistor 65 and the second current setting resistor 66 being the first input 57 of the second control voltage driver 56, a point of connection of the second current setting resistor 66 and the third current setting resistor 67 being connected to a control input 73 of the voltage-stabilized current regulator 68, a first terminal 74 of the voltage-stabilized current regulator 68 being connected to a second input 75 of the optocoupler 69, a second terminal 76 of the third current setting resistor 67 being connected to a second terminal 77 of the voltage-stabilized current regulator 68 and being the first output 59 of the second control voltage driver 56. At the same time, a first output 78 of the optocoupler 69 is connected to a first terminal 79 of the resistor 70 and is the second output 62 of the second control voltage driver 56, whereas a second terminal 80 of the resistor 70 is the second input 61 of the second control voltage driver 56.

Figure 2:
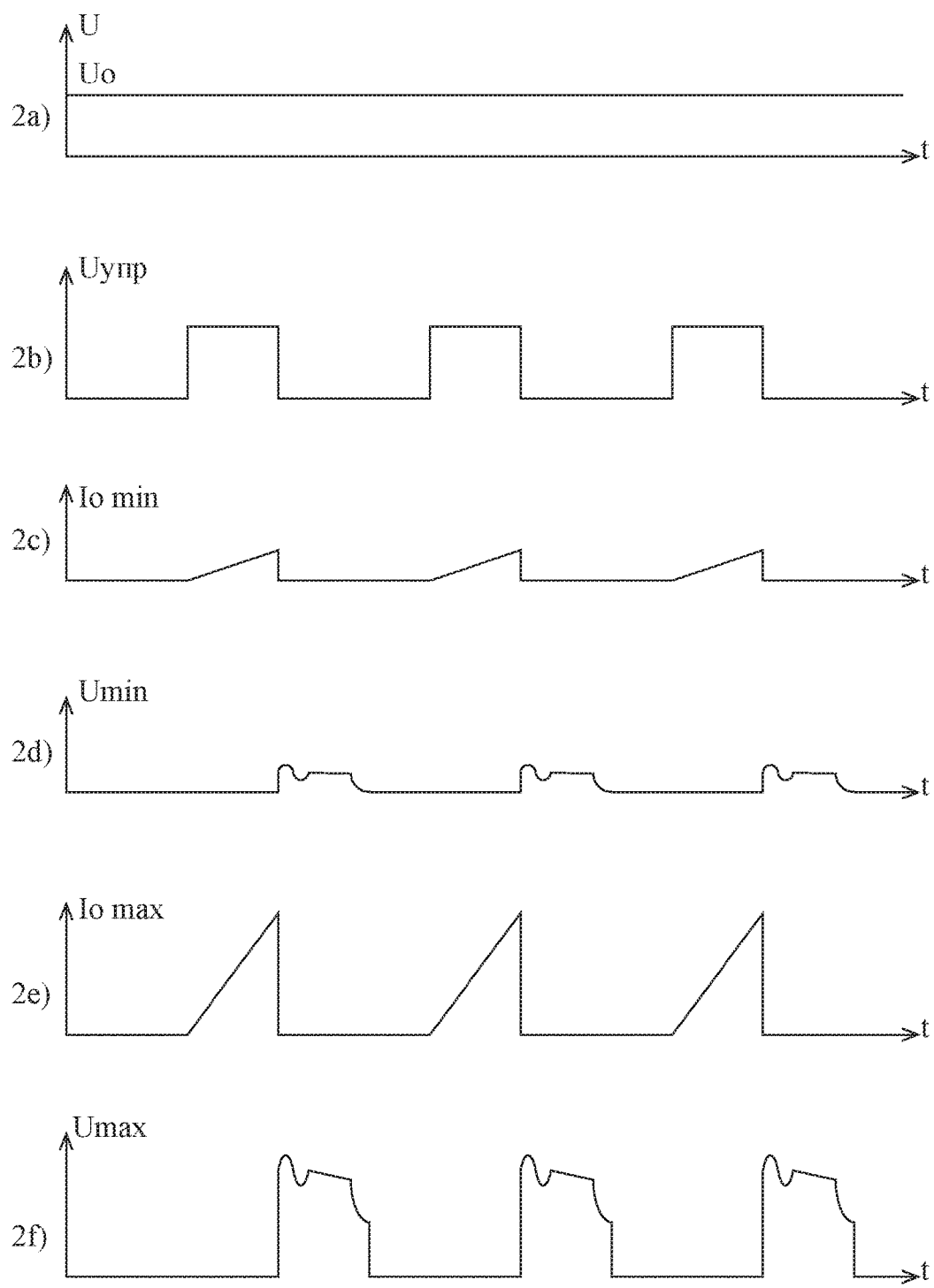
FIG. 2 shows time diagrams illustrating the operation of the converter of FIG. 1.

The time diagrams presented in FIG. 2 show:

2a—output voltage $U_o$ of the high voltage DC voltage source 1;

2b—pulses $U_{ctr}$ at the control input 16 of the controllable switch 10;

2c—ramp-up current flowing through the inductive load 2 supply circuit at the maximal resistance of the ECR 36 and reaching the minimal value $I_{o\ min}$ by the end of the pulse of $U_{ctr}$;

2d—high pulse voltage $U_{min}$ between the terminal 13 of the inductive load 2 and the terminal 43 of the ECR 36 at the maximal resistance of the ECR 36;

2e—ramp-up current flowing through the inductive load 2 supply circuit at the minimal resistance of the ECR 36 and reaching the maximal value $I_{o\ max}$ by the end of the pulse of $U_{ctr}$;

2f—high pulse voltage $U_{max}$ between the terminal 13 of the inductive load 2 and the terminal 43 of the ECR 36 at the minimal resistance of the ECR 36.

The way the proposed method is implemented is discussed below as exemplified in the operation of the converter of FIG. 1 embodying the method.

As DC voltage from the terminals of the low DC voltage source 28 is applied to the power inputs 30 and 64 of the controllable square wave generator 14, the latter starts generating square pulses (FIG. 2b), the pulse ratio of the square pulses being defined by the value of the control voltage applied from the output 26 of the first control voltage driver 17 to the control input 27 of the controllable square wave generator 14.

Changing the control voltage at the output 26 of the first control voltage driver 17 can be realized, for example, by moving the slider 25 of the potentiometer 19 connected by the terminals 20 and 22 thereof to the positive 21 and negative 23 terminals of the DC voltage source 18, respectively. In this way, generating a succession of control square pulses with regulated pulse ratio takes place.

The square pulses from the output 15 of the controllable square wave generator 14 arrive at the control input 16 of the controllable switch 10 (at the gate of the MOS transistor 11), resulting in opening the controllable switch 10. Pulse current starts flowing through the controllable switch 10 in the circuit: the positive terminal 9 of the high DC voltage source 1 (FIG. 2a)—the first terminal 8 of the inductive load 2—the second terminal 13 of the inductive load 2—the controllable switch 10—the limiting resistor 33—the ECR 36—the second terminal 43 of the ECR 36—the negative terminal 32 of the high DC voltage source 1.

In such a way, the succession of the control pulses periodically connects the inductive load 2 to the terminals of the high DC voltage source 1, has the pulse current through the inductive load 2 generated, and limits the same by means of the limiting resistor 33.

A self-inductance emf brought about in the inductive load 2 as this takes place prevents the current in the circuit from changing instantly. As a result of this, the current ramps up linearly during the square pulse (FIGS. 2c and 2e) and reaches, by the end of the square pulse, a preset value of $I_o$ (either $I_{o\ min}$ for FIG. 2c, or $I_{o\ max}$ for FIG. 2e). At this, the value of high pulse voltage between the terminal 13 of the inductive load 2 and the terminal 43 of the ECR 36 is proportional to the value of $I_o$. The value of $I_o$, however, is defined by resistance of all the elements of the above circuit, i.e.

$$I_o = K_1/(R_l + R_{tr} + R_{lim} + R_{ECR}) \qquad (1),$$

where $K_1$ is a proportionality coefficient, $R_l$—active resistance of the inductive load 2, $R_{tr}$—resistance of the open controllable switch 10 (resistance of the open MOS transistor 11), $R_{lim}$—resistance of the limiting resistor 33, $R_{ECR}$—resistance of the ECR 36.

Due to smallness $R_l \ll R_{lim}$ and $R_{tr} \ll R_{lim}$, the formula (1) can be reduced to $$I_o K_1/(R_{lim} + R_{ECR}) \qquad (2)$$

Thus, the value of $I_o$ and, consequently, the value of the high pulse voltage between the terminal 13 of the inductive load 2 and the terminal 43 of the ECR 36 can be set by changing the resistance of the ECR 36.

Such a change is achieved by means of changing output voltage of the rectifier 7 between the first, 58, and second, 60, outputs thereof (for example, due to the change of rectifier 7 load resistance). This changing voltage is applied to the first input 57 of the second control voltage driver 56 and is transferred, via the first current setting resistor 65, to the first input 72 of the optocoupler 69. Therefore, changing current flows via the optocoupler 69, the value of the current depending on the voltage at the first input 72 of the optocoupler 69 and on the parameters of the second current setting resistor 66, third current setting resistor 67, and voltage-stabilized current regulator 68. Accordingly, changing voltage appears also at the output 78 of the optocoupler 69 and at the first terminal 79 of the resistor 70, whose second terminal 80 is connected to the positive terminal 29 of the low DC voltage source 28 via the second input 61 of the second control voltage driver 56. This changing voltage is applied to the second output 62 of the second control voltage driver 56.

As voltage at the second output 62 of the second control voltage driver 56 changes, control voltage (arriving from the second output 62 of the second control voltage driver 56 to the control input 54 of the ECR 36) is applied via the second resistor 51 to the inverting ("−") input 55 of the OA 44 acting as a DC voltage amplifier. In that, the operation mode of the OA 44 is set by the voltage at the positive output 47 of the offset voltage source 46, the voltage being applied to the non-inverting ("+") input 48 of the OA 44. Thus, a control signal (whose value is defined by correlation of resistance of the first, 50, and second, 51, resistors setting transmission ratio of the OA 44) is generated at the output 45 of the OA 44 and directed to the gate of the MOS transistor 39. When the control signal is zero, the MOS transistor 39 is closed and has no effect on resistance $R_{add}$ of the additional resistor 40. Therefore, the resistance of the ECR 36 is maximal and amounts to $$R_{ECR} = R_{add} \qquad (3),$$

whereas $I_o$ is minimal and equals to $$I_{o\ min} = K_1/(R_{lim} + R_{add}) \qquad (4)$$

It is the minimal value of high pulse voltage between the terminal 13 of the inductive load 2 and the terminal 43 of the ECR 36 (FIG. 2d) and the minimal level of pulse electromagnetic noise radiated to the environment that correspond to the minimal current $I_{o\ min}$ flowing through the inductive load 2 at $R_{ECR} = R_{add}$ (FIG. 2c).

While the output voltage of the second control voltage driver 56 changes (which can be the case, for example, when lowering the output voltage of the rectifier 7), the control signal arriving to the gate of the MOS transistor 39 increases and opens the MOS transistor 39. Current starts flowing through the MOS transistor 39, and the through resistance of the MOS transistor starts decreasing and shunting $R_{add}$ of the additional resistor 40. Thus, the resultant resistance of the ECR 36 starts decreasing. At the extreme, where the signal arriving to the gate of the MOS transistor 39 is so large that the MOS transistor 39 is completely open, it fully shunts the additional resistor 40, resistance of the ECR 36 nears zero, and $I_o$ becomes maximal and equal to $$I_{o\ max}=K_1/R_{lim} \qquad (5).$$

It is the maximal value of high pulse voltage between the terminal 13 of the inductive load 2 and the terminal 43 of the ECR 36 (FIG. 2f) and the maximal level of pulse electromagnetic noise radiated to the environment that correspond to the maximal current $I_{o\ max}$ flowing through the inductive load 2 at $R_{ECR}=0$ (FIG. 2e).

Thus, changing the resistance of the ECR 36 at changing the output voltage of the second control voltage driver 56 makes it possible in the proposed method to change the current flowing in the above-discussed circuit within limits from $I_{o\ min}$ to $I_{o\ max}$. In this manner the value of the high pulse voltage between the terminal 13 of the inductive load 2 and the terminal 43 of the ECR 36 is set.

In the prior art, the prototype including, the pulse ratio is changed (for example by means of the first control voltage driver 17 and controllable square wave generator 14). However, as the pulse ratio changes, $I_o$ remains unchanged and equal to $I_{o\ max}$. Consequently, the value of high pulse voltage between the terminal 13 of the inductive load 2 and the terminal 43 of the ECR 36 remains unchanged.

Occurring with that is radiation to the environment, during the existence of the pulse, of a portion of pulse power $$P_{rad}=K_2I_{o\ max}^2 \qquad (6),$$

where $K_2$ is the second coefficient of proportionality.

Radiating a portion of the pulse power to the environment gives rise to pulse electromagnetic noise interfering with the operation of closely adjacent radio electronics and negatively affecting their efficiency. Additionally, electromagnetic radiation to the environment results in worsening ecology in the human environment.

To the contrary, it is suggested in the proposed technical solution to change $I_o$ within the limits between $I_{o\ min}$ and $I_{o\ max}$ by means of controlling resistance of the ECR 36. Therefore, the electromagnetic noise of maximum value $P_{rad}=K_2I_{o\ max}^2$ takes place only at the nominal value of the high pulse voltage between the terminal 13 of the inductive load 2 and the terminal 43 of the ECR 36. As $I_o$ decreases, the power of pulse electromagnetic noise falls as the square of the $I_o$, and due to that the influence of the noise on the efficiency of the closely adjacent radio electronics and the ecology in the human environment lowers.

Hence, the converter implementing the proposed method performs same functions when compared with converters embodying prior art methods. Its circuitry differs from that used in the prior art converters by making it possible to change not only the pulse ratio of the control square pulses, but also the value of the high pulse voltage between the terminal 13 of the inductive load 2 and the terminal 43 of the ECR 36, whereby the declared technical result is attained.

The functional units making the above-described converter can be realized in various ways.

For example, the controlled square wave generator 14 can include a microchip functioning as a pulse-width modulator (e.g., UCC2813QDR-5Q1 of Texas Instruments (TI)), or a microchip fulfilling the function of a pulse-frequency modulator (e.g. FAN-6300H of ON Semiconductor), or any other circuitry providing the pulse ration change in a succession of square pulses.

The first control voltage driver 17 can be realized as shown in FIG. 1 or using any other way of converting a control action to a control voltage, including a feedback loop.

The second control voltage driver 56 can be realized either as shown in FIG. 1 or employing conventional sources of reference voltage and operational amplifiers, or by using any other way of converting a control action to voltage controlling the ECR.

Microchip TL431 of TI or its analogs can be used as the voltage-stabilized current regulator shown in FIG. 1.

The transistor of the controllable switch 10 can be of a bipolar, or of a MOS, or of an IGBT-type. The switch itself can comprise additional circuitry improving its performance.

Low voltage sources 18, 28, and 46—in the converter as a whole and in the first control voltage driver 17 and the ECR 36 can be realized as one low voltage source provided with relevant resistive dividers.

The ECR 36 can be used as shown in FIG. 1, or employ circuitry disclosed in ABC of transistor circuitry by A. Petrov, R L, 1994 (http://zpostbox.ru/az0.htm, Ch. 11, Synchronous rectifiers), or use any other circuitry making it possible to change the resistance of a portion of a circuit from nearly zero to the value comparable with the resistance Rum.

All the other components of the converter are well known and disclosed in various sources dealing with pulse technique and radio electronics.

In any of the above implementations, changing current flowing through the inductive load and, thus, changing output pulse voltage is made possible, to thereby decrease the level of pulse electromagnetic noise radiated to the environment and, in this way, achieve the technical result of the present method of DC voltage to pulse voltage conversion.

What is claimed is:

1. A method of DC voltage—pulse voltage conversion comprising the steps of:
   providing DC voltage;
   generating a succession of controlling square pulses having adjustable pulse ratio;
   periodically connecting an inductive load to outputs of a source of said DC voltage using said succession of said controlling square pulses;
   generating pulse current flowing through said inductive load;
   adjusting said pulse current; and
   forming adjustable pulse voltage,
   wherein a predefined value of resistance of an electronically-controlled resistor included in a circuit of said pulse current flowing through said inductive load is formed, and said adjusting said pulse current is performed by said electronically-controlled resistor,
   to thereby adjust the level of pulse electromagnetic noise radiated to the environment.

* * * * *